United States Patent
Gilmer et al.

[11] Patent Number: 5,840,610
[45] Date of Patent: Nov. 24, 1998

[54] ENHANCED OXYNITRIDE GATE DIELECTRICS USING NF$_3$ GAS

[75] Inventors: Mark C. Gilmer, Austin; Mark I. Gardner, Cedar Creek, both of Tex.

[73] Assignee: Advanced Micro Devices, Inc., Sunnyvale, Calif.

[21] Appl. No.: 784,741

[22] Filed: Jan. 16, 1997

[51] Int. Cl.$^6$ .......................... H01L 21/336; H01L 21/31; H01L 21/469

[52] U.S. Cl. ........................... 438/301; 438/769; 438/770

[58] Field of Search ..................................... 438/770, 775, 438/769, 301

[56] References Cited

U.S. PATENT DOCUMENTS

| | | | |
|---|---|---|---|
| 5,043,224 | 8/1991 | Jaccodine et al. | 438/775 |
| 5,360,769 | 11/1994 | Thakur et al. | |
| 5,397,720 | 3/1995 | Kwong et al. | |
| 5,470,771 | 11/1995 | Fujii et al. | 438/594 |
| 5,541,141 | 7/1996 | Cho | 438/770 |
| 5,554,871 | 9/1996 | Yamashita et al. | 257/336 |
| 5,631,199 | 5/1997 | Park | 438/770 |

Primary Examiner—Richard A. Booth
Attorney, Agent, or Firm—Conley, Rose & Tayon; Robert C. Kowert; Kevin L. Daffer

[57] ABSTRACT

A semiconductor manufacturing process in which single crystal silicon substrate is immersed into an oxidation chamber maintained at a first temperature between 400° and 700° C. for a first duration. The oxidation chamber includes a first ambient gas of N$_2$ or Argon. A second ambient gas is then introduced into the oxidation chamber. The second ambient gas includes a fluorine species to remove any residual oxide from the upper surface of the semiconductor substrate and to form a fluorine terminated upper surface. The ambient temperature within said oxidation chamber is then ramped to a second temperature in the range of approximately 600° to 950° C. A third ambient gas is introduced into said oxidation chamber to form a base oxide layer on the fluorine terminated upper surface of said semiconductor substrate. The third ambient gas includes oxygen and, preferably, the base oxide layer consists essentially of silicon and oxide. A fourth ambient gas, which includes a nitrogen species, is then introduced into the oxidation chamber and the base oxide layer is reoxidized to form an oxynitride layer. Thereafter, a conductive gate structure is formed on the oxynitride layer and a source/drain impurity distribution is introduced into a pair of source/drain regions within the semiconductor substrate.

21 Claims, 2 Drawing Sheets

ENHANCED OXYNITRIDE GATE DIELECTRICS USING NF₃ GAS

BACKGROUND OF THE INVENTION

1. Field of the Invention

This invention relates to semiconductor fabrication and more particularly to an improved method for forming a transistor by forming an oxynitride gate dielectric in a fluorine bearing ambient.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor geometries shrink below 0.5 micron, the limitations of conventional transistor processing become more apparent. As the thickness of the gate oxide decreases below 50 angstroms, devices become more susceptible to diffusion of electrically active impurities located in the conductive gate structure across the gate oxide and into the active area of the transistor where the impurities can alter the threshold voltage of the device. This problem is especially acute for boron implanted gate structures. In addition, thinner oxides increase concerns about hot carrier damage and oxide breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate slowing the device and, eventually, raising the temperature above the operational limit of the device.

Nitrogen bearing gate dielectrics including oxynitride gate dielectrics have been used to enhance the quality of thin (ie., less than 100 angstroms) gate oxides and to reduce boron penetration. In Kwong (U.S. Pat. No. 5,397,720), for example, a method of forming an oxynitride gate electric is disclosed. The Kwong method consists essentially of growing an oxynitride layer in an $N_2O$ ambient and thereafter increasing the nitrogen concentration within the dielectric by introducing heated $NH_3$. Unfortunately, the Kwong method results in a nitrogen concentration profile that has a maximum at the substrate/dielectric interface. In addition to its tendency to limit boron penetration, a nitrogen distribution in close proximity to the transistor channel region is believed to undesirably limit the carrier mobility within the channel resulting in slower devices. In addition, the Kwong method results in a slow dielectric growth rate during the $N_2O$ phase of the process. Similarly, in Cho (U.S. Pat. No. 5,541,141), an oxynitride gate dielectric is grown with a 3-stage process. During the first and third phases, an $N_2O$ ambient is used. During the second phase, $NH_3$ is added to the $N_2O$ mixture to control the oxidation rate and the influx of nitrogen to the oxynitride film. Like the Kwong method, the Cho method results in a nitrogen concentration having a peak at the silicon substrate interface.

Therefore, it would be highly desirable to fabricate MOS gate dielectrics in a manner that would improve the gate dielectric quality and prevent the penetration of boron atoms into the transistor channel without substantially reducing the carrier mobility within the transistor channel and without a significant decrease in the oxidation rate.

SUMMARY OF THE INVENTION

The problems identified above are in large part addressed by a semiconductor manufacturing process in which a gate dielectric including an oxynitride is formed upon a fluorine terminated upper surface of the silicon substrate. Incorporating nitrogen into the gate dielectric significantly reduces penetration of boron from the conductive gate into the transistor channel. The fluorine terminated silicon substrate is believed to be effective in reducing the quantity of incomplete bonds at the silicon-dielectric interface thereby improving the reliability of the dielectric. In the preferred embodiment, the nitrogen concentration peak is displaced from the dielectric/substrate interface to minimize the impact on carrier mobility.

Broadly speaking, the present invention contemplates a semiconductor manufacturing process a single crystal silicon is immersed into an oxidation chamber maintained at a first temperature between 400° and 700° C. for a first duration. The oxidation chamber includes a first ambient gas of $N_2$ or Argon. A second ambient gas is then introduced into the oxidation chamber. The second ambient gas includes a fluorine species to remove any residual oxide from the upper surface of the semiconductor substrate and to form a fluorine terminated upper surface. The ambient temperature within said oxidation chamber is then ramped to a second temperature in the range of approximately 600° to 950° C. A third ambient gas is introduced into said oxidation chamber to form a base oxide layer on the fluorine terminated upper surface of said semiconductor substrate. The third ambient gas includes oxygen and preferably, the base oxide layer consists essentially of silicon and oxide. A fourth ambient gas, which includes a nitrogen species, is then introduced into the oxidation chamber and the base oxide layer is reoxidized to form an oxynitride layer. Thereafter, a conductive gate structure is formed on the oxynitride layer and a source/drain impurity distribution is introduced into a pair of source/drain regions within the semiconductor substrate.

Preferably, the semiconductor substrate includes a p-type epitaxial layer formed on a p+ silicon bulk. A preferred resistivity of the epitaxial layer is in the range of approximately 10 to 15 Ω-cm. The first ambient gas preferably includes oxygen in a approximate concentration of 1 to 10 percent. The second ambient gas preferably includes $NF_3$ and an inert gas such as $N_2$ or Argon. A preferred concentration of $NF_3$ in the second ambient is in the range of approximately 1 to 10 percent. The base oxide layer thickness is ideally in the range of approximately 10 to 20 angstroms. The nitrogen species in the fourth ambient preferably includes NO or $N_2O$. In one embodiment, the fourth ambient gas also includes $NF_3$ to accelerate a reoxidation rate of said base oxide layer. The process may further include the step of annealing the oxynitride layer in an inert ambient, such as Argon, to reduce the layer's fluorine concentration. In a presently preferred embodiment, the conductive gate structure is formed by chemically vapor depositing polysilicon at a temperature in the range of approximately 500° to 650° C. at a pressure less than approximately 2 torrs implanting a gate impurity distribution into the polysilicon to reduce the sheet resistivity of said polysilicon to less than approximately 500 Ω/square. In one embodiment, a nitrogen species may be introduced into said polysilicon to further prevent boron penetration from the gate. In one embodiment of the process, the oxidation is an oxidation furnace while in another embodiment, the oxidation chamber is a rapid thermal apparatus.

The present invention further contemplates a transistor. The transistor includes a single crystal silicon semiconductor substrate. The substrate includes a fluorine terminated upper surface. A gate dielectric layer is formed on the upper surface of the semiconductor substrate. The gate dielectric layer includes a nitrogen distribution having a peak concentration that is vertically displaced above an interface between the gate dielectric and the semiconductor substrate by a first displacement. A peak concentration of the nitrogen distribution is preferably in the range of approximately $10^{17}$ to $10^{20}$ atoms/cm$^3$. In one embodiment, the gate dielectric layer includes an oxynitride layer formed on a base oxide layer and the peak concentration of the nitrogen distribution is located within the oxynitride layer. Preferably, the first displacement is in the range of approximately 10 to 20 angstroms. The transistor further includes a conductive gate formed on the gate dielectric layer and a source/drain impurity distribution substantially contained within a pair of source/drain regions laterally displaced on either side of a channel region of said semiconductor substrate. The conductive gate comprises polysilicon having a sheet resistivity of said polysilicon is less than approximately 500 Ω/square. The polysilicon may suitably include a second nitrogen distribution to further prevent penetration of mobile impurities such as boron.

The present invention still further contemplates a method of forming a dielectric upon a semiconductor surface. A residual oxide is removed from an upper surface of said semiconductor substrate in a fluorine bearing ambient such that a fluorine terminated upper surface is formed. A base oxide layer that is substantially free of nitrogen is then formed on the semiconductor substrate. The base oxide layer is reoxidized in a reoxidizing ambient comprising nitrogen, and oxygen to form an oxynitride layer. The reoxidizing ambient preferably includes fluorine to accelerate the reoxidation rate. The method may further include, annealing said oxynitride layer in an Argon ambient to reduce the fluorine concentration in the oxynitride layer.

BRIEF DESCRIPTION OF THE DRAWINGS

Other objects and advantages of the invention will become apparent upon reading the following detailed description and upon reference to the accompanying drawings in which.

Figure 1:
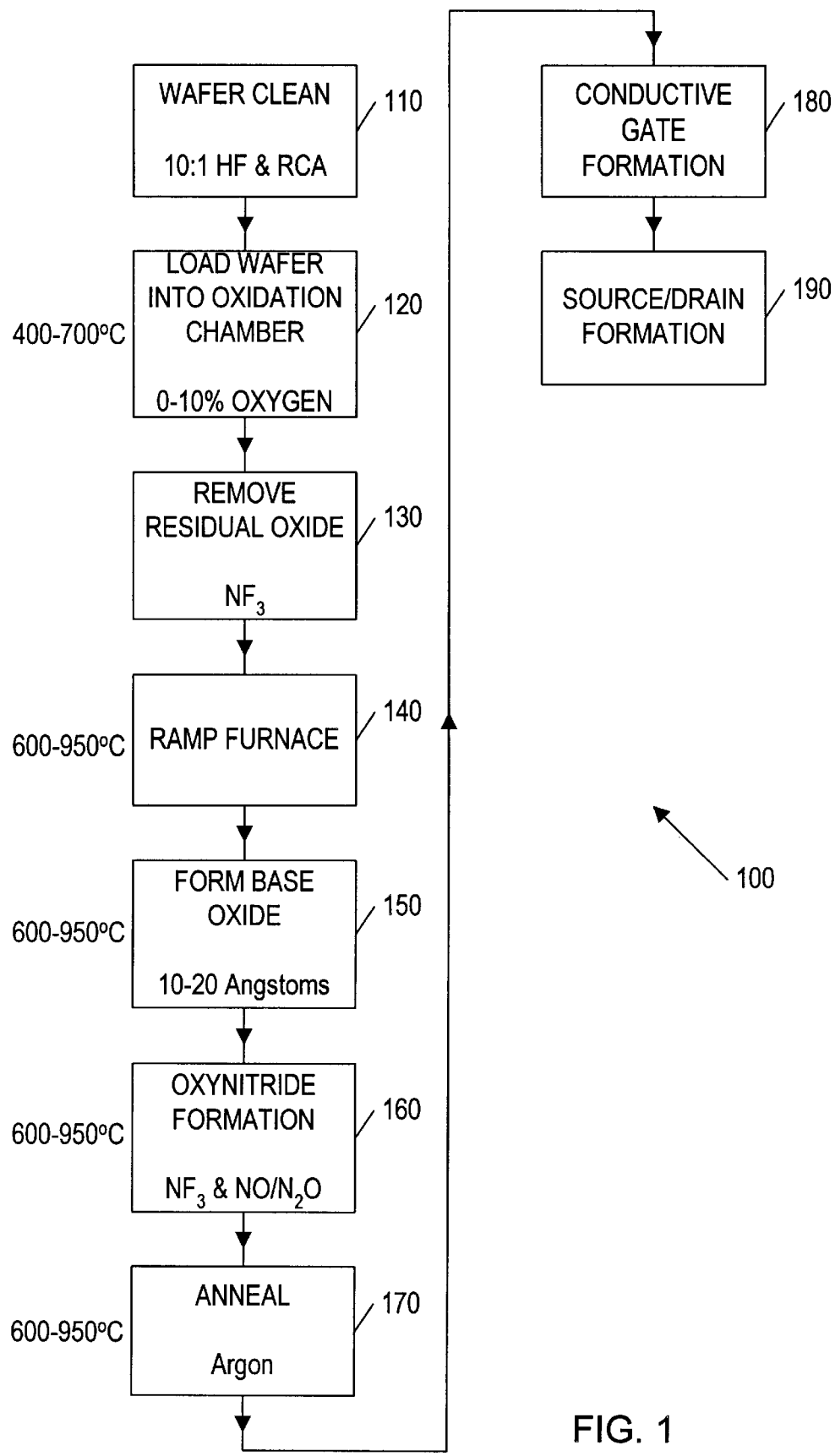
FIG. 1 is a flow diagram of a semiconductor process for incorporating nitrogen into the gate dielectric of an MOS transistor.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1, a flow diagram for a process of forming an oxynitride gate dielectric in accordance with the present invention is shown. Process 100 includes a wafer clean 110, a wafer load 120, residual oxide removal 130, furnace ramp 140, base oxide formation 150, oxynitride growth 160, anneal 170, gate formation 180, and source/drain formation 190. A single crystal semiconductor substrate, typically in the form of a substantially circular silicon wafer, is provided. In a presently preferred embodiment, the semiconductor substrate includes a p-type epitaxial layer formed on a p+ silicon bulk. The crystal orientation of the substrate is preferably 100. A resistivity of the epitaxial layer is preferably in the range of approximately 10 to 15 Ω-cm. Prior to the formation of the oxynitride dielectric, an upper surface of the semiconductor substrate is cleaned in the process step shown in the flow diagram as reference numeral 110. The preferred wafer clean includes the steps of immersing the semiconductor substrate in a 10:1 HF solution to remove any residual oxide and thereafter performing a standard RCA clean. In a typical RCA clean, a wafer is immersed in a solution of $H_2O$—$NH_4OH$—$H_2O_2$ in an approximate ratio of 5:1:1 by volume heated to approximately 75° C. to 80° C. After five to fifteen minutes in the solution, the wafers are removed and rinsed in deionized water. This portion of the cleaning procedure is designed to remove residual organic contaminants found on the wafer. Thereafter, to remove any oxide formed during the immersion in the first solution, the wafer is submerged for approximately 15 seconds into a mixture of 10:1 HF. To remove any atomic and ionic contaminants, the wafer is subsequently immersed in a solution of $H_2O:HCl:H_2O_2$ in an approximate ratio of 6:1:1 by volume heated to approximately 75° C. to 80° C. The wafer is held in this HCl solution for approximately 10 to 15 minutes. For further information regarding the standard RCA clean, see 1 Stanley Wolf and Richard N. Tauber, *Silicon Processing For The VLSI Era* 516–17 (Lattice Press 1986).

Subsequent to wafer clean 110, the semiconductor substrate is immersed into an oxidation chamber containing a first ambient gas maintained at a first temperature between approximately 400° C. and 700° C. for a first duration in the process step indicated in FIG. 1 by reference numeral 120. In a preferred embodiment, the immersing of the semiconductor substrate is accomplished by loading the semiconductor substrate into a quartz or silicon carbide boat and pushing the boat into a gate oxidation furnace. In a presently preferred embodiment, the first ambient gas predominantly comprises an inert species such as $N_2$ or Argon with a 1 to 10% mixture of oxygen. In lieu of pushing the wafer into an oxidation furnace, the wafer may be placed into the process chamber of a rapid thermal apparatus. As indicated previously, the oxidation chamber may comprise a rapid thermal apparatus. In a rapid thermal process, a single semiconductor substrate is placed in a chamber and rapidly heated to a desired temperature for a relatively short duration compared with the duration contemplated for an oxidation furnace. In one embodiment, (not shown in FIG. 1) of process step 120, the first ambient gas may consist of pure Argon.

After the semiconductor substrate has been immersed into the oxidation chamber, any residual oxide that has formed on the semiconductor substrate surface is removed in process step 130 with a second ambient gas comprising a mixture of $NF_3$ and Argon or $N_2$. The removal of the residual oxide in the presence of $NF_3$ results in a fluorine terminated silicon upper believed to extend approximately one or two atomic layers into the silicon substrate. It is theorized that, by terminating loosely dangling bonds in the silicon substrate, the fluorine increases the reliability and lifetime of a subsequently formed dielectric layer without significantly reducing the carrier mobility in the channel region of the semiconductor substrate. After the residual oxide is removed, furnace ramp 140 is performed during which the ambient temperature within the oxidation chamber is ramped to a second temperature. In the presently preferred embodiment, the second temperature is in the range of approximately 600° C. to 950° C. Thereafter, a base oxide layer in process step 150, preferably 10 to 20 angstroms in thickness, is formed on the fluorinated terminated upper surface of the silicon substrate. The base oxide layer is formed in an oxygen bearing, nitrogen free third ambient such that the base oxide layer consists essentially of silicon and oxygen. The formation of a substantially nitrogen free silicon oxide layer prior to the oxynitride layer formation is believed to minimize the undesirable reduction of carrier mobility within the transistor channel due to the presence of nitrogen proximal to the dielectric/silicon interface. A fourth ambient gas comprising $NF_3$ and a nitrogen-oxide species such as NO or $N_2O$ is then introduced into the oxidation chamber in process step 160 to reoxidize a portion of the base oxide layer and produce an oxynitride layer. The oxynitride layer comprises silicon, oxygen, and nitrogen. The introduction of $NF_3$ into the oxidation chamber during the oxynitride layer formation facilitates an increased concentration of nitrogen within the oxynitride layer and increases the rate at which the reoxidation occurs. In the preferred embodiment, a peak concentration of nitrogen within the oxynitride layer is approximately $10^{17}$ to $10^{20}$ atoms/cm$^3$.

The presence of $NF_3$ within the oxidation chamber during reoxidation step 160 increases the oxidation rate such that the time required to produce a given thickness of gate dielectric is reduced. In a preferred embodiment, the reoxidation rate during step 160 is in the range of approximately 5 to 15 angstroms per minute. Subsequently, an anneal cycle 170 is performed during which the oxynitride layer is annealed preferably in an Argon ambient at an anneal temperature in the range of approximately 600° C. to 950° C. for a duration in the range of approximately 30 seconds to 20 minutes.

After the formation of the gate dielectric layer, a conductive gate is formed on the oxynitride layer in process step 180. Preferably, the formation of the conductive gate includes the step of chemically vapor depositing polysilicon. The polysilicon is preferably deposited at a temperature in the range of approximately 500° C. to 650° C. at a pressure preferably less than approximately 2 torrs. Thereafter, the sheet resistivity of the polysilicon is reduced by implanting a gate impurity distribution into the polysilicon. In one embodiment, a p-type impurity such as boron is implanted into the polysilicon if the transistor is of the p-channel variety while phosphorous or arsenic is implanted into the n-channel polysilicon. In another embodiment, the conductive gate may comprise a metal such as aluminum, copper, tungsten, or an alloy thereof. In one embodiment, a second nitrogen distribution may be introduced into the conductive gate to further prevent the penetration of boron into the transistor channel region. In such an embodiment, the introduction of the second nitrogen distribution is preferably accomplished with an ion implantation into the conductive gate layer using an implant dose in the range of approximately $10^{13}$ to $10^{15}$ atoms/cm$^2$. After the conductive gate layer has been appropriately doped, the conductive gate structure is formed by patterning the conductive gate with conventional photolithography and etching techniques. Subsequent to the formation of the conductive gate, the source and drain terminals of the transistor are formed in process step 190 by introducing a source/drain impurity distribution into a pair of source/drain regions within the semiconductor substrate. In a preferred embodiment, the source/drain impurity distribution is introduced into the source/drain regions with an ion implantation using an implant dose greater than approximately $10^{15}$ atoms/cm$^2$. The formation of the conductive gate and the source/drain regions are well known to those skilled in the art of semiconductor processing.

Figure 2:
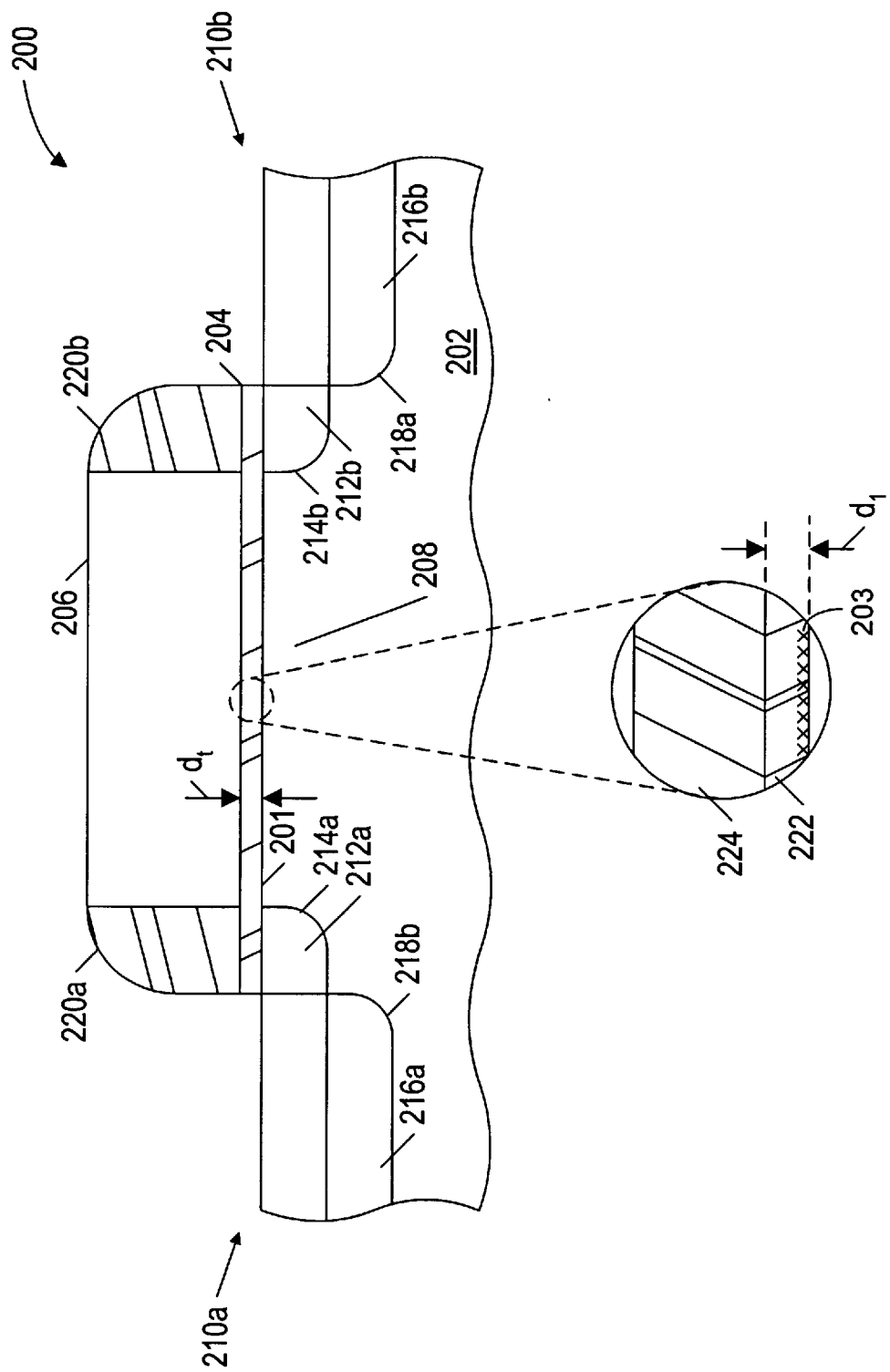
FIG. 2 is a partial cross-sectional view of a semiconductor transistor including a fluorine terminated substrate upper surface and a nitrogen bearing gate dielectric.

Turning now to FIG. 2, a transistor 200 is shown. Transistor 200, formed in accordance with semiconductor process 100 as described with respect to FIG. 1, includes a semiconductor substrate 202, a gate dielectric 204, a conductive gate 206 and a pair of source/drain regions 210a and 210b laterally displaced on either side of a channel region 208. In the preferred embodiment, a starting material for semiconductor substrate 202 includes a p-type epitaxial layer formed on a p+ silicon bulk. Gate dielectric layer 204 includes a nitrogen distribution. In the preferred embodiment, a peak concentration of the nitrogen distribution within gate dielectric 204 is vertically displaced above upper surface 201 of semiconductor substrate 202 by a first displacement $d_1$. In the preferred embodiment, the first displacement is in the range of approximately 10 to 20 angstroms. A preferred thickness $d_t$ of gate dielectric 204 is preferably less than 50 angstroms and still more preferably in the range of approximately 25 to 35 angstroms. Gate dielectric layer 204 includes oxynitride layer 224 formed upon a base oxide layer 222. In this embodiment, base oxide layer 222 provides a nitrogen depleted region between conductive gate 206 and silicon substrate 200. A preferred thickness of base oxide layer 222 is in the range of approximately 5 to 25 angstroms. The presence of a nitrogen depleted base oxide layer 222 minimizes the undesirable reduction of carrier mobility and with it, device speed, due to the presence of nitrogen proximal to or within channel region 208 of semiconductor substrate 202. In a presently preferred embodiment, the peak nitrogen concentration within gate dielectric 204 is in the range of approximately $10^{17}$ to $10^{20}$ atoms/cm$^2$. At the interface between gate dielectric 204 and semiconductor substrate 202, transistor 200 includes a sheet of fluorine terminated silicon molecules 203. It is believed that the presence of fluorine terminated molecules 203 may reduce the quantity of dangling bonds at the $Si/SiO_2$ interface thereby reducing the interface trap charge. This reduction in interface trap charge is believed to result in a more reliable dielectric as measured by $Q_{BD}$, mean time to failure (MTTF), instantaneous failure rate, or any other reliability measurement. See 3 Stanley Wolf, *Silicon Processing for the VLSI Era* 438–48 (Lattice Press 1995) for a discussion of dielectric reliability measurements.

Transistor 200 further includes conductive gate 206. Conductive gate 206 is aligned over channel region 208 or semiconductor substrate 202. In one embodiment, conductive gate 206 is a heavily doped polysilicon having a sheet resistivity less than approximately 500 Ω/square. In an alternative embodiment, conductive gate 206 comprises a metal such as aluminum, copper, tungsten, or an alloy thereof. Conductive gate 206 may include a nitrogen distribution to further prevent the penetration of electrically active impurities within conductive gate 206 such as boron from penetrating gate dielectric 204 to channel region 208 of semiconductor substrate 202. Ideally, a nitrogen distribution within conductive gate 206 will have a peak concentration proximal to (i.e., within approximately 50 angstroms) the interface between conductive gate 206 and gate dielectric 204. Transistor 200 further includes a pair of source/drain impurity distributions 210a and 210b which are laterally displaced on either side of transistor channel 208. In the embodiment shown in FIG. 2 the source/drain impurity distributions 210 comprise a lightly doped impurity distribution 212a and 212b substantially located within a pair of lightly doped regions 214a and 214b and a heavily doped source/drain impurity distribution 216a and 216b located within heavily doped regions 218a and 218b respectively. The lightly doped regions shown in FIG. 2 are well known in the field of semiconductor processing and are more fully described in 2 Stanley Wolf, *Silicon Processing For VLSI Era* 354–56 (Lattice Press 1990). Consistent with the presence of lightly doped regions 214a and 214b, transistor 200 further includes a spacer structure 220a and 220b formed on respective sidewalls of conductive gate 206. Space structures 220a are preferably formed by depositing a conformal dielectric, preferably by depositing a TEOS film with a low pressure (i.e., less than 2 torrs) CVD process. Thereafter, the conformal dielectric is etched with an anisotropic etch process designed to leave behind space structures such as spacer structures 220 on vertical surfaces of the underlying topography.

It will be apparent to those skilled in the art having the benefit of this disclosure that the present invention contemplates a method and structure for reducing boron penetration in MOS transistors, increasing the gate dielectric quality and minimizing the reduction in carrier mobility within the channel region of the transistor. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A semiconductor manufacturing process comprising:
   providing a semiconductor substrate, wherein said semiconductor substrate comprises single crystal silicon;
   immersing said semiconductor substrate into an oxidation chamber maintained at a first temperature between 400° and 700° C. for a first duration, said oxidation chamber comprising a first ambient gas selected from the group consisting of $N_2$ and Argon;
   subsequent to said immersing, introducing a second ambient gas comprising a first fluorine species into said oxidation chamber to remove a residual oxide from said semiconductor substrate and to form a fluorine terminated upper surface of said semiconductor substrate;
   subsequent to said introducing a second ambient gas, ramping the ambient temperature within said oxidation chamber to a second temperature in the range of approximately 600° to 950° C.;
   introducing a nitrogen-free, fluorine-free third ambient gas comprising oxygen into said oxidation chamber to form a base oxide layer on said fluorine terminated upper surface of said semiconductor substrate, wherein said base oxide layer is substantially free of nitrogen;
   introducing a fourth ambient gas comprising oxygen, nitrogen, and a second fluorine species into said oxidation chamber to form an oxynitride layer by reoxidizing said base oxide layer;
   forming a conductive gate structure on said oxynitride layer; and
   introducing a source/drain impurity distribution into a pair of source/drain regions laterally displaced on either side of a channel region of said semiconductor substrate wherein said channel region is aligned with said conductive gate.

2. The process of claim 1, wherein said semiconductor substrate comprises a p-type epitaxial layer formed on a p+ silicon bulk, wherein a resistivity of said epitaxial layer is between approximately 10 to 15 Ω-cm.

3. The process of claim 1, wherein said first ambient gas further comprises oxygen in a approximate concentration of 1 to 10 percent.

4. The process of claim 1, wherein said second ambient gas comprises $NF_3$ and an inert gas selected from the group consisting of $N_2$ and Argon.

5. The process of claim 4, wherein a concentration of said $NF_3$ in said second ambient is in the range of approximately 1 to 10 percent.

6. The process of claim 1, wherein a thickness of said base oxide layer is in the range of approximately 10 to 20 angstroms.

7. The process of claim 1, wherein said base oxide layer consists essentially of silicon and oxide.

8. The process of claim 1, wherein said fourth ambient gas comprises a species selected from the group consisting of NO and $N_2O$.

9. The process of claim 8, wherein said second fluorine species comprises $NF_3$ to accelerate a reoxidation rate of said base oxide layer.

10. The process of claim 9, further comprising annealing said oxynitride layer in an inert ambient to reduce the fluorine concentration.

11. The process of claim 10 wherein said inert ambient comprises Argon.

12. The process of claim 1, wherein the step of forming a conductive gate structure comprises:
   chemically vapor depositing polysilicon at a temperature in the range of approximately 500° to 650° C. at a pressure less than approximately 2 torrs; and
   implanting a gate impurity distribution into said polysilicon to reduce the sheet resistivity of said polysilicon to less than approximately 50 Ω/square.

13. The process of claim 12 further comprising, subsequent to the step of depositing said polysilicon, introducing a nitrogen species into said polysilicon.

14. The process of claim 1, wherein the step of introducing said source/drain impurity distribution comprises implanting ions selected from the group consisting of boron, phosphorous, and arsenic into said pair of source/drain regions, wherein an implant dose for said ion implanting is greater than approximately $10^{15}$ atoms/cm$^2$.

15. The process of claim 1 wherein said oxidation chamber comprises an oxidation furnace.

16. The process of claim 1 wherein said oxidation chamber comprises a rapid thermal process apparatus.

17. A method of forming a dielectric upon a semiconductor surface comprising:
   removing a residual oxide from an upper surface of said semiconductor substrate in a fluorine bearing ambient such that a fluorine terminated upper surface is formed, wherein said removing is performed in a chamber at 400° to 700° C.;

ramping up the chamber temperature to 600° to 950° C.;

forming a base oxide layer substantially free of nitrogen by exposing the upper surface to a nitrogen-free, fluorine-free ambient; and reoxidizing said base oxide layer in a reoxidizing ambient comprising nitrogen, oxygen, and fluorine to form an oxynitride layer.

18. The method of claim 17 wherein said fluorine in said reoxidizing ambient accelerates the reoxidation rate.

19. The method of claim 18 further comprising the step of annealing said oxynitride layer in an Argon ambient to reduce the fluorine concentration in the oxynitride layer.

20. The process of claim 1, wherein a peak concentration of nitrogen within said oxynitride layer is approximately $10^{17}$ to $10^{20}$ atoms/cm$^3$.

21. The method of claim 17, wherein a peak concentration of nitrogen within said oxynitride layer is approximately $10^{17}$ to $10^{20}$ atoms/cm$^3$.

* * * * *